(12) United States Patent
Ashby

(10) Patent No.: US 6,228,672 B1
(45) Date of Patent: May 8, 2001

(54) STABLE SURFACE PASSIVATION PROCESS FOR COMPOUND SEMICONDUCTORS

(75) Inventor: Carol I. H. Ashby, Edgewood, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/182,756

(22) Filed: Oct. 29, 1998

(51) Int. Cl.$^7$ ..................................................... H01L 21/00
(52) U.S. Cl. .............................. 438/38; 438/26; 438/762; 438/767; 437/129; 437/173; 357/52; 257/98
(58) Field of Search ................................ 438/38, 26, 762, 438/767; 437/173, 946, 129; 357/52; 257/98

(56) References Cited

U.S. PATENT DOCUMENTS

| | | | |
|---|---|---|---|
| 5,451,542 | * 9/1995 | Ashby | 437/173 |
| 5,799,028 | * 8/1998 | Geels et al. | 372/49 |
| 5,933,705 | * 8/1999 | Geels et al. | 438/26 |

* cited by examiner

Primary Examiner—Richard Elms
Assistant Examiner—Pho Luu
(74) Attorney, Agent, or Firm—Gregory A. Cone

(57) ABSTRACT

A passivation process for a previously sulfided, selenided or tellurated III–V compound semiconductor surface. The concentration of undesired mid-gap surface states on a compound semiconductor surface is reduced by the formation of a near-monolayer of metal-(sulfur and/or selenium and/or tellurium)-semiconductor that is effective for long term passivation of the underlying semiconductor surface. Starting with the III–V compound semiconductor surface, any oxidation present thereon is substantially removed and the surface is then treated with sulfur, selenium or tellurium to form a near-monolayer of chalcogen-semiconductor of the surface in an oxygen-free atmosphere. This chalcogenated surface is then contacted with a solution of a metal that will form a low solubility chalcogenide to form a near-monolayer of metal-chalcogen-semiconductor. The resulting passivating layer provides long term protection for the underlying surface at or above the level achieved by a freshly chalcogenated compound semiconductor surface in an oxygen free atmosphere.

20 Claims, 1 Drawing Sheet

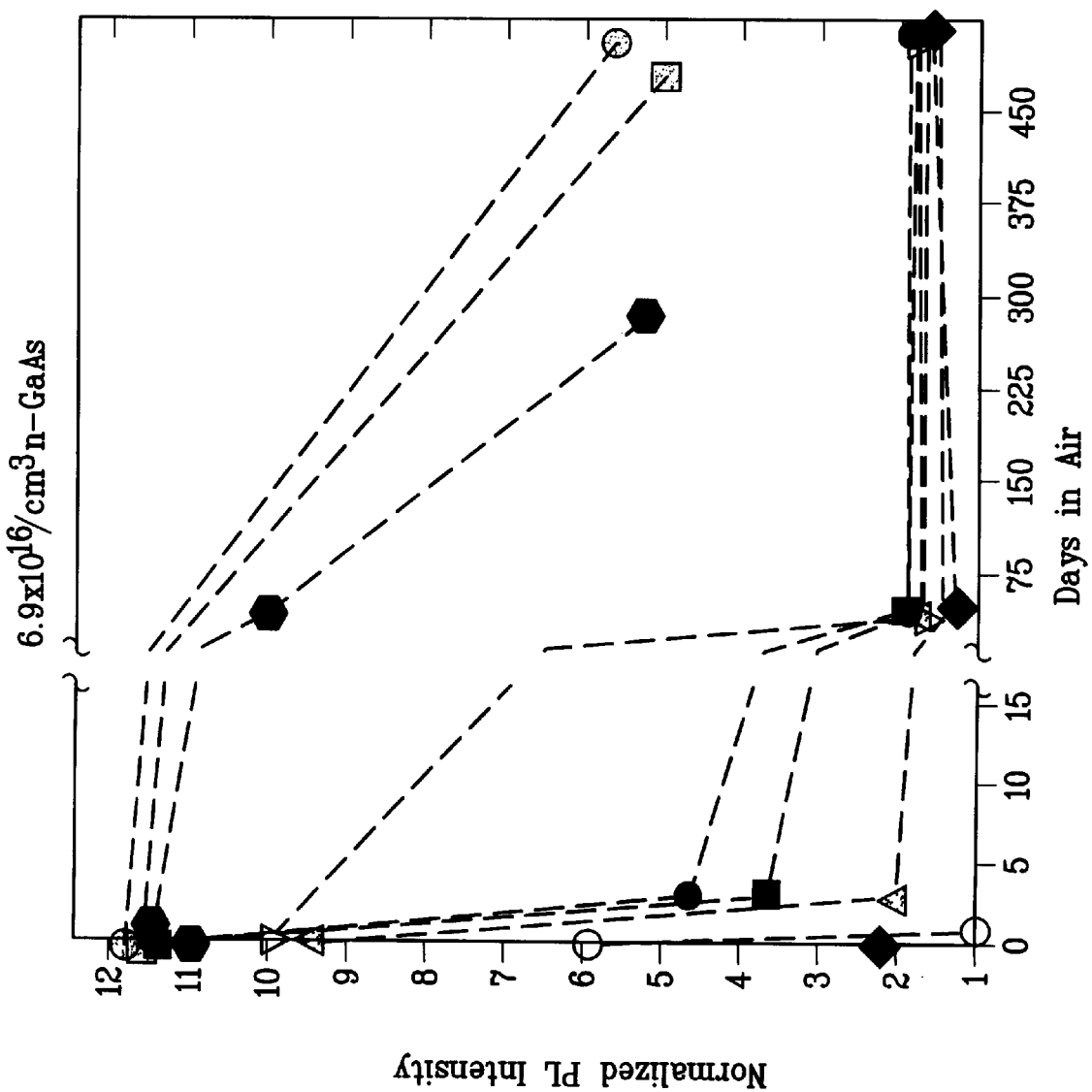
FIGURE

STABLE SURFACE PASSIVATION PROCESS FOR COMPOUND SEMICONDUCTORS

STATEMENT REGARDING FEDERALLY SPONSORED RESEARCH OR DEVELOPMENT

This invention was made with Government support under Contract DE-AC04-94AL85000 awarded by the U.S. Department of Energy. The Government has certain rights in the invention.

CROSS-REFERENCE TO RELATED APPLICATIONS

Not applicable.

REFERENCE TO A "MICROFICHE APPENDIX"

Not applicable.

BACKGROUND OF THE INVENTION

This invention relates to methods for passivating the surfaces of semiconductors. More particularly, this invention relates to methods for stabilizing such passivated surfaces from the deleterious effect of oxidation for compound semiconductors.

It has been demonstrated for most III–V compound semiconductors that sulfidation of the surface results in improved electronic properties through the reduction of mid-gap surface states that promote rapid surface carrier recombination. Treatment with selenium has also been investigated and has been shown to sometimes work somewhat better than sulfur. Calculations for tellurium on GaAs have suggested that tellurium, in the chalcogen family with sulfur and selenium, would not have the same effect on mid-gap state as S and Se and has not been used for this purpose. High surface recombination velocities and/or Fermi-level pinning due to a high density of mid-gap surface states ($>10^{12}/cm^2$) have diminished the performance of heterojunction bipolar transistors (HBTs) and delayed the realization of metal-insulator-semiconductor (MIS) devices in III–V compound semiconductors. Reaction of the GaAs (or other III–V compound semiconductor) surface with sulfur or its compounds produces a dramatic decrease in the interface states responsible for surface recombination and Fermi-level pinning. This sulfidation has been accomplished in a number of ways including immersion in aqueous $Na_2S$ and/or NH4Sx solutions, anodic sulfidation, treatments with polythiols, exposure to $H_2S$ that has been thermally or plasma activated, and photosulfidation. The following references are of interest in these areas and are incorporated by reference herein in their entirety: C. J. Sandroff, R. N. Nottenburg, J. C. Bischoff, and R. Bhat, Appl. PHys. Lett. 51, 33 (1987) (treatment of HBTs with $Na_2S$, instability of the S-treated surface); E. Yablonovich, C. J. Sandroff, R. Bhat, and T. Gmitter Appl. Phys. Lett. 52, 439 (1988)(treatment with $NH_4S$, $Li_2S$, $Na_2S$): J. F. Fan, H. Oigawa, and Y. Nannichi, Jpn.J. Appl. Phys. 27, L1331 (1988) (treatment with $(NH_4)_2S_x$); S. Shikata, H. Okada, and H. Hayashi, J. Appl. Phys. 69, 2717 (1991)(($NH_4)_2S_x$ suppression of emitter size effect on beta of HBTs; and J. S. Herman and F. L. Terry, J. Vac. Sci. Technol. A11, 1094 (1993) (treatment with $H_2S$ plasma). A preferred process is the photosulfidation process taught in U.S. Pat. No. 5,451,542 that utilizes UV photodissociation of sulfur vapor to form reactive S species that react with a semiconductor surface that has had the native oxide removed.

Unfortunately, the major problem with all these approaches has been the instability of the sulfided surface with respect to oxidation when exposed to air. Selenided surfaces are somewhat better but suffer from oxidation effects as well. As these surfaces re-oxidize, the density of mid-gap states rapidly returns to its original level. There have been at least two attempts to passivate these sulfidated surfaces against re-oxidation: a glow discharge in sulfur vapor with the GaAs heated to 400° C., X.Hou, X. Chen, Z. Li, X. Ding, and X. Wang. Appl. Phys. Lett. 69, 1429 (1996), and immersion in $S_2Cl_2/CCl_4$, X. Cao, X. Hou, X. Chen, Z. Li,R. Su, X. Ding, and X. Wang, Appl. Phys. Lett. 70, 747 (1997). Despite their air stability, these processes are limited for actual device applications by either the high temperatures employed or the over-etching of GaAs by $S_2Cl_2$, which necessitates in-situ measurement of current gain to terminate the etch process at maximum device performance.

There remains an unmet need in the art for a process that easily provides for a stable passivation of a low-surface-state-density surface of a III–V semiconductor that is resistant to the deleterious effects of re-oxidation in air.

BRIEF SUMMARY OF THE INVENTION

The method of this invention is based upon the reaction of a pre-chalcogenided surface with a metal ion in solution to form a new metal-chalcogenided surface that retains the good surface electronic properties of the III–V-S surface while being more oxygen resistant than a "bare" chalcogenided surface. As will be explained more fully below, the scope of the invention is intended to encompass compound semiconductor surfaces that have been treated with sulfur, selenium or tellurium. These are the members of the chalcogen family, other than oxygen. For simplicity, most of the discussion that follows will be described in the context of a sulfidated surface. When 'chalcogen' or 'chalcogenided' are used, use of sulfur, selenium or tellurium should be understood.

The basic steps are as follows. First, the native oxide on the III–V surface is removed if necessary. Then, the non-oxidized surface is chalcogenated. When sulfur is the chalcogen employed, the surface may be sulfidated by any of the above mentioned processes, but preferably by the UV photodissociation process taught in U.S. Pat. No. 5,451,542. It is most preferable to deposit essentially a monolayer of chalcogen on the surface to replace deleterious surface electronic states with more electronically desirable ones, but less than a monolayer or multiple monolayers may also be deposited (any of which will be taken herein to mean a "near monolayer"). The final step is to immerse the chalcogenated semiconductor in a solution of a metallic (or a nonmetallic) element that can form a relatively insoluble sulfide, selenide, and/or telluride. This group of cations includes but is not restricted to the alkali metals, the alkaline earth metals, the transition metals, the lanthanides, the actinides, and the group IIB metals such as Zn and Cd. A number of other metals should also work due to their ability to assume a tetrahedral configuration coupled with their atomic radius to provide a good lattice match. The anion in solution is conveniently a sulfate, chloride or fluoride, but other anions can also be employed because the anions may not be incorporated into the final stabilized surface near monolayer. The solution preferably employs water as the solvent, but use of another solvent, such as an alcohol or other solvent that can dissolve suitable quantities of metal salts and promote formation of relatively insoluble metal sulfides, selenides, and/or tellurides, can be employed as well.

BRIEF DESCRIPTION OF THE DRAWINGS

FIG. 1 is a graph showing photoluminescence response following passivation of a sulfidated surface by several different metals.

DETAILED DESCRIPTION OF THE INVENTION

It appears that the most preferable results are produced from a step-wise formation of a metal-chalcogen-semiconductor structure by reaction of a metal ion with the previously sulfided, selenided, or tellurided surface, with preferably a near-monolayer of sulfur, selenium, and/or tellurium present, to form the ultra-thin metal-chalcogenide-semiconductor structure that has very few in-gap interface/surface states to degrade the electronic surface properties of the compound semiconductor.

This near-monolayer structure has been formed by the following process. The native oxide was removed from a GaAs sample (doped n-type at $6.9 \times 10^{16}/cm^3$) in an inert atmosphere box using 1:20 $NH_4OH/H_2O$. Experiments have indicated that the semiconductor surface need not be absolutely free of oxides in order for the process to proceed successfully. Indeed, there is some indication that very minor amounts of oxygen are helpful to the long term stability of the final metal-chalcogen-semiconductor near monolayer. The sample was then blown dry with $N_2$ and loaded into the photosulfidation chamber without intermediate exposure to air. After evacuation of the chamber, the sample surface was exposed to UV light (<320 nm) and sulfur vapor ($S_8$) was admitted into the chamber at a pressure <$10^{-5}$ Torr while the sample was illuminated. This procedure has been shown by previous work to produce up to a monolayer of $S^{2-}$ covalently bonded to the Ga and/or As of the GaAs surface, with the amount of sulfidation depending on the degree to which the surface has been freed of native oxide. The sample was then removed from the chamber, transported under $N_2$ to a photoluminescence (PL) apparatus, and the PL intensity was measured with the sample protected from air exposure by a flowing $N_2$ curtain. Roughly a 6-fold increase in PL intensity vs. the same material with native oxide present was obtained. This sulfided-surface sample was then returned quickly (<1 min air exposure) to the inert-atmosphere chamber. The surface was covered with 0.01 M $ZnSO_4$ solution for 2 minutes, rinsed with water, and blown dry with $N_2$. The Zn-treated sample was then removed from the inert-atmosphere chamber, and the PL was re-measured. Within experimental uncertainty, no decrease in PL intensity from that of the original sulfided surface was seen. After more than 34 hours of air exposure, no significant change in PL intensity occurred. In contrast, an unprotected, unstabilized sulfided surface would have lost most if not all of the PL intensity improvement during a similar exposure.

For a sample treated with $ZnSO_4$ or $ZnCl_2$ before removal from the inert atmosphere, an air-stable >12-fold improvement in PL intensity was obtained compared to the initial PL for a sulfur only layer on the semiconductor. These results are consistent with even transient air exposure without metal stabilization producing a 50% decrease in passivation due to rapid surface re-oxidation. The metal stabilization process described herein prevents this degradation and appears to preserve maximum passivation even with extended air exposure. Metal stabilization of the sulfided surface has produced stable electronic properties, as manifested by PL intensity, for over a month. For air exposures in excess of 50 days the PL response declines to about 0.5 of the initial passivation level. This latter value is apparently retained indefinitely since no further degradation in the PL response is apparent after 500 days of air exposure for most of the metals tested.

Zn produced the best results of the various cations tested to date. Review of FIG. 1 shows that PL response after 300 days in air for all the metal samples was equivalent to the initial PL response for the S-only layer on the semiconductor, prior to exposure to oxygen.

PL measurements on zinc-sulfided GaAs samples of different doping levels have revealed an air-stable surface/interface state density possibly as low as the mid-$10^{10}/cm^2$ range, which is of sufficient quality to enable fabrication of metal-insulator-semiconductor (MIS) devices. This air-stable PL improvement is greater or equal to the best achieved with sulfur-only treatments. The PL intensity has remained unchanged by subsequent air exposure. These results demonstrate the ability of the metal-sulfided surface to retain the improved surface electronic properties produced by up to a monolayer of sulfur even after extended exposure to an oxygen-containing environment that would have degraded the unstabilized sulfided surface. The Zn-treated surface remained stable with no alteration of PL intensity during heating in air to temperature in excess of 138° C.

The air stability of the passivation efficacy of other metals, including $Ca^{2+}$, $Ni^{2+}$, $Mn^{2+}$, $Zn^{2+}$, $Fe^{3+}$, and $La^3$ has been tested and is displayed in FIG. 1. All produce improved surface properties on GaAs (100), with the largest effect being produced by metal ions for which there is no increased energetic penalty for assuming tetrahedral coordination geometry as opposed to the octahedral coordination geometry and which have Briggs-Slater radii close to Ga. $Ni^{2+}$, which strongly favors octahedral coordination, produces the least PL improvement while tetrahedrally coordinating $Zn^{2+}$ and $Ga^{3+}$ exhibit both very large PL increases and good long-term stability. A more complete list of suitable metals would include the following: Zn, Cd, Hg, Be, Mg, Ca, Sr, Ba, Mn, Tc, Re, Fe, Ru, Os, Ni, Al, Ga, In, Tl, and La. These metals can assume the preferred tetrahedral configuration and have an atomic radius that would provide for an acceptable lattice match. Since sulfur passivation has been shown to improve the surface electronic of all III–V compound semiconductors, it is to be expected that this process should be applicable to semiconductors other than GaAs. The best metal ion for semiconductors other than GaAs might be one other than zinc. Sulfate, chloride and fluoride salts produce comparable results. Both n-type and p-type GaAs exhibit comparable PL improvements. Thus, this approach of deposition of roughly a monolayer of metal sulfide on the GaAs surface appears to be a very versatile way of achieving very low surface state density that is air stable at temperatures below 140° C. Greater thermal stability may be possible with judicious selection of both metal ion and counter ion.

The chemical bonds that are created by this new passivation process are not well understood at this time. It is known that the sulfur-semiconductor bond quickly breaks down in the presence of oxygen. It is also known that depositing the metal by itself directly onto the oxide-free semiconductor produces a brief improvement in PL that rapidly returns upon contact with oxygen to the level obtained with the native oxide alone. However, XPS analysis indicates that this new passivation process yielding the metal-sulfur-semiconductor near-monolayer produces a different As—S bonding state than is present when only sulfidation is done. This new As—S bond appears to be very similar to the As—O bond. It may be that a new As—S species has been formed or that the S has somehow mediated a different As—O bond. In any event, the new metal-sulfur-semiconductor near-monolayer has produced long term (100's of days) performance levels for the protected semiconductor that are equivalent to those of a freshly sulfidated semiconductor layer that has not been exposed to oxygen. Similar effects have been calculated for selenium and tellurium, and it is anticipated that experiments will demonstrate their beneficial effects.

Because sulfur, selenium, and/or tellurium improve the surface electronic properties of virtually every III–V compound semiconductor, the following discussion in terms of GaAs is considered to be equally applicable to the entire range of III–V materials and devices. This process of metal stabilization of a sulfided surface has been applied to GaAs-based heterojunction bipolar transistors (HBTs). The beta (a measurement of gain and therefore of device quality) of small-area HBTs was increased from about half that of large-area HBTs to a value comparable to the unpassivated of the large-area HBTs. The large-area HBTs' betas were increased by about 10% by this new process. These results are indicative of the near-total suppression of surface recombination due to high surface state densities; surface recombination is a significant limiting process for optimal small-area HBT performance.

Breakdown voltage is a limiting characteristic of metal-semiconductor field effect transistors (MESFETs) that is related to high surface recombination resulting from high surface state densities. There is no existing process technology that can minimize surface recombination problems on all exposed surfaces of the MESFET. This new process should increase breakdown voltage in these devices.

The operation of photonic bandgap lasers and other mesa-geometry quantum dot/quantum wire devices is severely limited by the depth of the surface depletion region resulting form the high density of mid-gap states on native III–V surfaces. There has previously been no good solution to this problem because of the very small device dimensions (<500 nm) involved. This new process which reduces surface state density by deposition of a near-monolayer of material can reduce depletion depths to shallower than 2 nm and will be an enabling technology for such nanostructure devices.

This is the first process for stabilizing the improved surface properties resulting from sulfidation that does not require deposition of a sufficiently thick encapsulant layer to exclude oxygen access to the surface. This is therefore the first technology that requires no alteration of device architecture to accommodate the deposition of oxygen-impermeable encapsulant layers. It is also the first that is generally applicable to a fully fabricated, metallized device or circuit that neither etches or otherwise attacks the device nor introduces process-related damage, as in the case of plasma-based encapsulant deposition processes. Additionally, this new process can be performed at room temperature. This near-monolayer of metal-sulfur-semiconductor can be covered with another protective layer, such as silicon oxynitride, without losing its desirable properties or decreasing the performance of the underlying semiconductor in the course of the deposition process for the additional protective layer.

The preceding detailed description has set forth several examples of various embodiments of the process of this invention. A skilled practitioner will be able to create further embodiments of the invention from the guidance provided herein. The true scope of the invention is therefor not to be limited to the above examples but to be found in the appended claims.

What is claimed is:

1. A process for passivating a sulfidated, selenated, or tellurated III–V compound semiconductor surface comprising:
   forming a near monolayer of a chalcogen selected from the group consisting of sulfur, selenium, or tellurium, on the surface which is substantially free of native oxide and
   contacting the chalcogenated surface with a metal ion solution to form an ultra-thin structure of metal-chalcogen that is chemically bonded to the semiconductor surface that, when dried, is effective to prevent degradation of the surface by reformation of a high-surface-state-density surface composition, wherein the process is operable at room temperature.

2. The process of claim 1 wherein native oxide on the surface has been removed prior to formation of the chalcogen monolayer on the surface.

3. The process of claim 1 wherein the chalcogenation of the surface is accomplished by exposure of the surface to UV light in the presence of the chalcogen vapor in an oxygen-free atmosphere.

4. The process of claim 1 wherein the ultra-thin structure of metal-chalcogen-semiconductor is effective to reduce the mid-gap surface states on the semiconductor surface to less than the mid-$10^{11}$/cm$^2$ range.

5. The process of claim 1 wherein the metal is one that forms a chalcogenide of low solubility.

6. The process of claim 5 wherein the metal is one that assumes a tetrahedral coordination geometry.

7. The process of claim 5 wherein the metal is one selected from the group consisting of the alkali metals, the alkaline earth metals, the transistion metals, the lanthanides, the actinides, and the group IIB metals such as Zn and Cd.

8. The process of claim 5 wherein the metal is one selected from the group consisting of Zn, Cd, Hg, Be, Mg, Ca, Sr, Ba, Mn, Tc, Re, Fe, Ru, Os, Ni, Al, Ga, In, Tl, and La.

9. The process of claim 5 wherein the metal forms the metal-ion solution in conjunction with an anion selected from the group consisting of sulfates, chlorides and fluorides.

10. The process of claim 1 wherein the solvent for the solution is water or an alcohol.

11. A process for passivating a sulfidated III–V compound semiconductor surface comprising: forming a near monolayer of sulfur on the surface which is substantially free of native oxide by exposing the surface to UV light in the presence of sulfur vapor in an oxygen-free atmosphere and contacting the sulfidated surface with a metal ion solution to form an ultra-thin structure of metal-sulfur that is chemically bonded to the semiconductor surface that, when dried, is effective to prevent degradation of the surface by reformation of a high-surface-state-density surface composition.

12. The process of claim 11 wherein native oxide on the surface has been removed prior to formation of the sulfur monolayer on the surface.

13. The process of claim 11 wherein the ultra-thin structure of metal-sulfur-semiconductor is effective to reduce the mid-gap surface states on the semiconductor surface to less than the mid-$10^{11}$/cm$^2$ range.

14. The process of claim 11 wherein the metal is one that forms a sulfide of low solubility.

15. The process of claim 14 wherein the metal is one that assumes a tetrahedral coordination geometry.

16. The process of claim 14 wherein the metal is one selected from the group consisting of the alkali metals, the alkaline earth metals, the transition metals, the lanthanides, the actinides, and the group IIB metals such as Zn and Cd.

17. The process of claim 14 wherein the metal is one selected from the group consisting of Zn, Cd, Hg, Be, Mg, Ca, Sr, Ba, Mn, Tc, Re, Fe, Ru, Os, Ni, Al, Ga, In, Tl, and La.

18. The process of claim 14 wherein the metal forms a solution in conjunction with an anion selected from the group consisting of sulfates, chlorides and fluorides.

19. The process of claim 11 wherein the solvent for the solution is water or an alcohol.

20. The process of claim 11 wherein the metal is Zn and the process is one that is operable at room temperature.

* * * * *